(12) United States Patent
Voigt

(10) Patent No.: US 10,489,161 B2
(45) Date of Patent: Nov. 26, 2019

(54) NVM OBJECT

(71) Applicant: Hewlett Packard Enterprise Development LP, Houston, TX (US)

(72) Inventor: Douglas L. Voigt, Boise, ID (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 332 days.

(21) Appl. No.: 15/123,367

(22) PCT Filed: Mar. 26, 2014

(86) PCT No.: PCT/US2014/031907
§ 371 (c)(1),
(2) Date: Sep. 2, 2016

(87) PCT Pub. No.: WO2015/147817
PCT Pub. Date: Oct. 1, 2015

(65) Prior Publication Data
US 2017/0075695 A1    Mar. 16, 2017

(51) Int. Cl.
*G06F 9/44* (2018.01)
*G06F 9/4401* (2018.01)
(Continued)

(52) U.S. Cl.
CPC .......... *G06F 9/4401* (2013.01); *G06F 3/0604* (2013.01); *G06F 3/0632* (2013.01); *G06F 3/0637* (2013.01); *G06F 3/0652* (2013.01); *G06F 3/0688* (2013.01); *G06F 9/4418* (2013.01); *G06F 12/1408* (2013.01); *G06F 12/1458* (2013.01); *G11C 16/20* (2013.01); *G06F 2212/1052* (2013.01); *G06F 2212/402* (2013.01)

(58) Field of Classification Search
CPC ............. G06F 12/1408; G06F 12/1458; G06F 2212/1052; G06F 2212/402; G06F 3/0604; G06F 3/0632; G06F 3/0637; G06F 3/0652; G06F 3/0688; G06F 9/4401; G06F 9/4418; G11C 16/20
See application file for complete search history.

(56) References Cited

U.S. PATENT DOCUMENTS 6,128,627 A    10/2000    Mattis et al.
6,247,168 B1   6/2001     Green
(Continued)

FOREIGN PATENT DOCUMENTS

EP    1675008 A2    6/2006

OTHER PUBLICATIONS

Coburn, et al.; "NV-heaps: Making Persistent Objects Fast and Safe with Next-Generation, Non-Volatile Memories", Mar. 5-11, 2011, 13 Pgs.

(Continued)

*Primary Examiner* — Fahmida Rahman
(74) *Attorney, Agent, or Firm* — Hewlett Packard Enterprise Patent Department

(57) ABSTRACT

A property is determined of an object in nonvolatile memory (NVM) of a device after the device is restarted. An action is performed on the NVM object based on the determined property of the NVM object. The property includes at least one of a volatility and executable information of the NVM object.

15 Claims, 4 Drawing Sheets

(51) Int. Cl.
*G11C 16/20* (2006.01)
*G06F 3/06* (2006.01)
*G06F 12/14* (2006.01)

(56) References Cited

U.S. PATENT DOCUMENTS

| | | | |
|---|---|---|---|
| 6,735,680 B2 * | 5/2004 | Ahmad | G06F 12/0253 |
| | | | 711/103 |
| 6,766,432 B2 | 7/2004 | Saltz | |
| 8,433,865 B2 | 4/2013 | Miller et al. | |
| 8,487,946 B2 | 6/2013 | Stauffer et al. | |
| 2002/0184434 A1 * | 12/2002 | Kawaura | G06Q 20/105 |
| | | | 711/102 |
| 2005/0071665 A1 | 3/2005 | Zimmer et al. | |
| 2006/0282654 A1 | 12/2006 | Van der Veen et al. | |
| 2007/0294497 A1 * | 12/2007 | Chen | G06F 12/1466 |
| | | | 711/164 |
| 2011/0066790 A1 | 3/2011 | Mogul et al. | |
| 2012/0290785 A1 | 11/2012 | Ergan et al. | |
| 2013/0205197 A1 * | 8/2013 | O'Neill | G06Q 10/10 |
| | | | 715/236 |
| 2014/0068718 A1 * | 3/2014 | Mureinik | G06F 21/604 |
| | | | 726/4 |
| 2014/0082261 A1 | 3/2014 | Cohen et al. | |

OTHER PUBLICATIONS

International Searching Authority, The International Search Report and the Written Opinion, PCT/US2014/031907, dated Dec. 16, 2014, 10 Pgs.

Narayanan, et al.; "Whole-System Persistence", Mar. 3-7, 2012, 10 Pgs.

\* cited by examiner

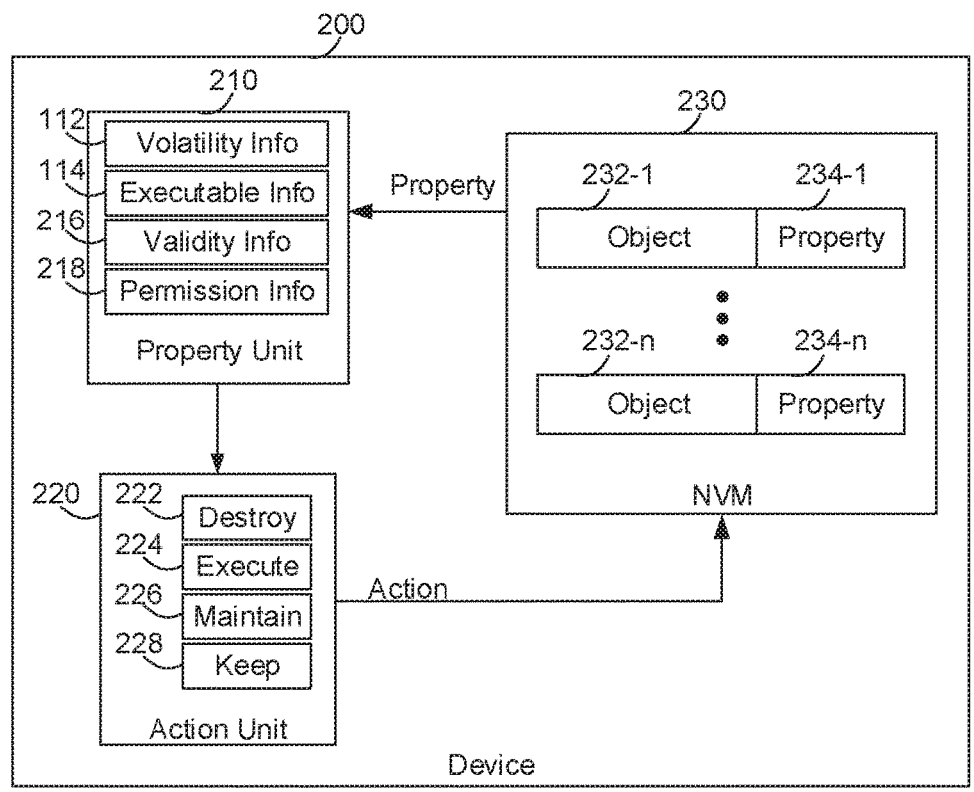

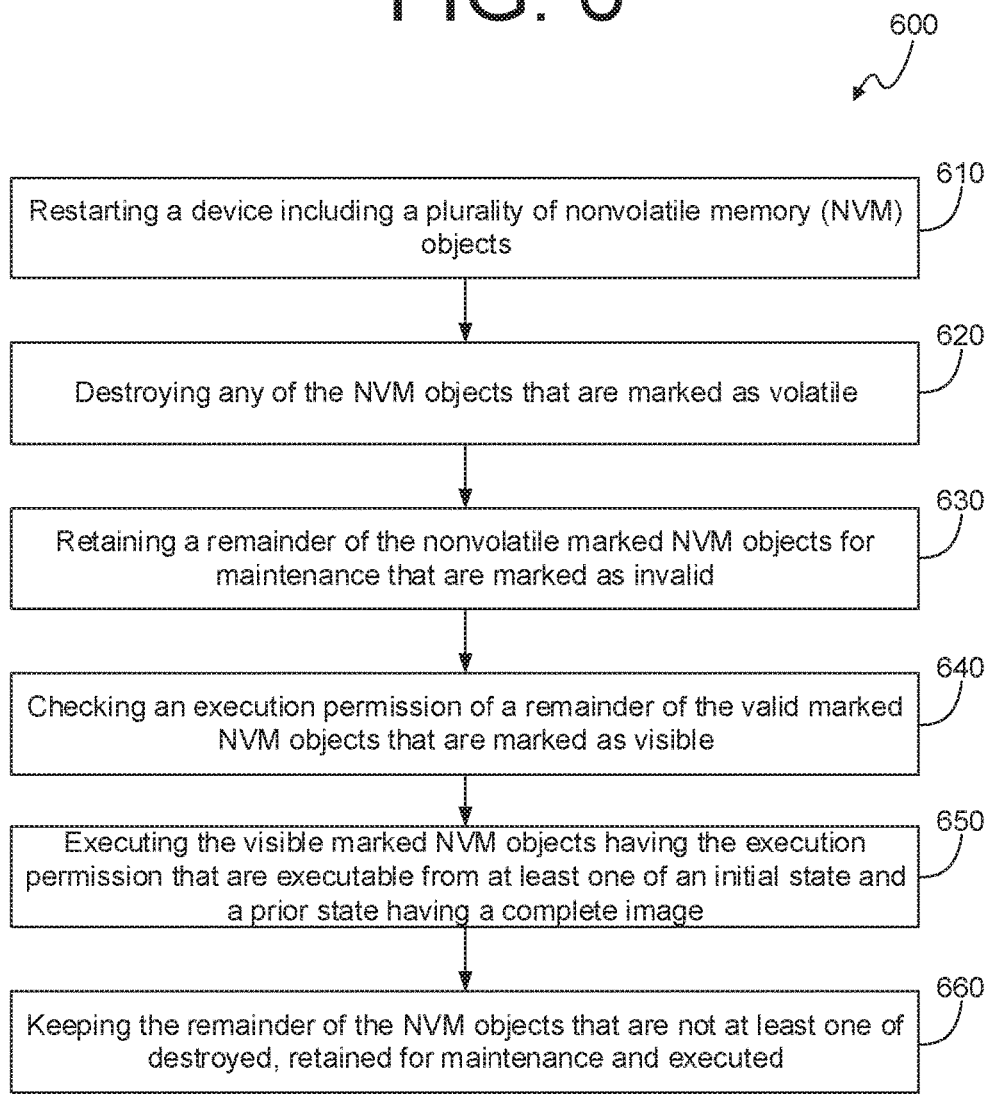

NVM OBJECT

BACKGROUND

Non-volatile memory (NVM) technology may be used to store data in systems. Such data may be used by systems upon restarting to execute various types of scripts. Users, such as administrators and/or vendors, may be challenged to improve use of such data.

BRIEF DESCRIPTION OF THE DRAWINGS

The following detailed description references the drawings, wherein:

FIG. 2 is another example block diagram of a device to perform an action on an NVM object after restart;

FIG. 3 is an example table of actions by the device of FIG. 2 based on a property of the NVM object;

FIG. 6 is another example flowchart of a method for acting on an NVM object based on a marking of the NVM object.

DETAILED DESCRIPTION

Figure 1:
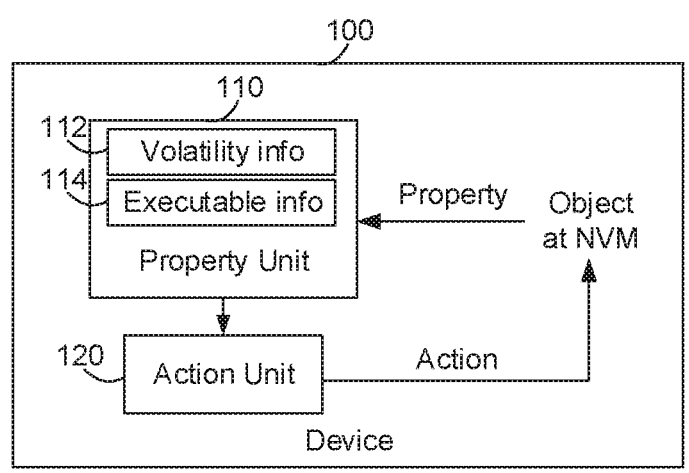
FIG. 1 is an example block diagram of a device to perform an action on an NVM object after restart.

Specific details are given in the following description to provide a thorough understanding of embodiments. However, it will be understood that embodiments may be practiced without these specific details. For example, systems may be shown in block diagrams in order not to obscure embodiments in unnecessary detail. In other instances, well-known processes, structures and techniques may be shown without unnecessary detail in order to avoid obscuring embodiments.

Nonvolatile memory (NVM) in device ay present several new use cases that motivate a new decision process at points where processes may be started or restarted, either all at once or individually. For example, NVM may be treated as volatile even though NVM is capable of non-volatility. Also. NVM may contain complete process images that were captured when processes were previously suspended such as during shutdown or process movement between servers. This information may add to factors that are used during restart on current systems, such as permission information or validity information.

However, current systems may use scripts and action filtering to process a sequence of actions during restart. Thus, current systems may not consider questions of volatility and execute-ability of process images stored in NVM, such as during server bootstrap. Having executable images represented as NVM objects with properties may be a new capability that is not exploited by the current systems. In mobile computing, decisions about process images may reside in NVM. However, execution decisions in mobile computing apply to the whole device based on sleep or hibernation processes, rather than information about specific NVM objects.

Examples may structure decision making for how to act on various NVM objects in a system when the system restarts or when processes are relocated. An example device may include a property unit and an action unit. The property unit may determine a property of an object in nonvolatile memory (NVM) of the device, after a restart of the device. The action unit may perform an action on the NVM object based on the determined property of the NVM object. The property may include volatility information and/or executable information of the NVM object. The actions taken by the action unit may include destroying, maintaining, retaining and/or executing the NVM object.

Thus, examples may group and automate process restart decisions in response to NVM object characteristics. For example, an advantageous precedence and ordering relationship may be implemented for decisions involving new properties of NVM objects such as volatility and execute-ability, together with other information such as validity and permissions. Examples may also structure the restarting of multiple processes based on information in NVM objects using a dependency tree. The net results of these decisions can be pipelined and spread across multiple cores in a Symmetric multiprocessing (SMP) system to reduce a total time required for the restart.

Referring now to the drawings. FIG. 1 is an example block diagram of a device to perform an action on an NVM object after restart. The device 100 may include any type of device to interface with and/or include a NVM, such as a storage device, a controller, a driver, a notebook computer, a desktop computer, an all-in-one system, a server, a network device, a wireless device, a storage device, a mobile device, a thin client, a retail point of sale device, a gaming device, a scientific instrument, and the like.

The device 100 is shown to include a property unit 110 and action unit 120. The property and action units 110 and 120 may include, for example, a hardware device including electronic circuitry for implementing the functionality described below, such as control logic and/or memory. In addition or as an alternative, the property and action units 110 and 120 may be implemented as a series of instructions encoded on a machine-readable storage medium and executable by a processor.

A number of new NVM technologies are emerging that allow primary storage to reside in main memory. Using these technologies, files or objects that are relevant to applications may be stored in groups of memory ranges. A memory range may be a set of NVM bytes that can be described using an address and a length. For simplicity, the term "NVM object" may to refer to the NVM ranges which, when grouped together, form a body of data or code that is relevant to an application.

Some NVM objects may contain data such as a picture, a document, an index or a table. Other NVM objects may contain executable programs. Still other NVM objects may contain process images complete with state that allows processes to be resumed from where they left off. These NVM objects may include properties that are also nonvolatile. Some of these properties may describe the content of the NVM object and/or an expected use of the NVM object.

The property unit 110 may determine a property of an object in NVM of the device 100, after a restart of the device 100. The action unit 120 may perform an action on the NVM object based on the determined property of the NVM object. The property and action units 110 and 120 may be described in further detail below with respect to FIG. 2. The property may include volatility information 112 and/or executable information 114 of the NVM object.

Contemporary Operating Systems (OSs) assume existence of volatile memory for temporary areas, stacks, IO buffers, etc. Persistent memory is assumed to be used in addition to volatile memory or special content organized as memory ranges, files or objects. In some cases, NVM may be used to store data that should be considered volatile. For example, some NVM technologies may be less expensive than volatile memory, such as Dynamic random-access memory (DRAM). Thus, NVM may be used to store data even when non-volatility is not needed.

However, using persistent memory for volatile purposes may expose computers to additional security risks such as sniffing of unprotected data or implanting malicious executable objects. Therefore, examples may seek to clear out volatile regions either on shut-down or on restart. For example, this may be done automatically by persistent memory controllers or by specially written components of OS boot-loader or shut-down code. Thus, volatility information 112 may be a property that identifies volatile objects stored in NVM.

As mentioned above, some NVM objects may contain process images. The use of NVM to store process images may be at odds with an OS's volatility assumptions. Stacks, for example, may be required to be part of process images in order to enable resumption of process execution. Examples may resolve this by considering the entire process image to be one object that does not have the volatile property if resumption of execution is desired.

In some cases, it might be desirable to automatically resume execution of some process images at various points in the life of a system or process. For example, if a system has been restarted, then some or perhaps all of the processes that were running when the system stopped should run again. These could be processes that offer necessary OS services. Alternatively, users may desire continuity of applications across restarts, providing the illusion of the "always-on" user experience common to mobile computing.

Therefore, execution instructions such as "execute on restart", "resume on restart" or "resume after migration" may also be properties of NVM objects, as shown by the executable information 114 and as explained in further detail with respect to FIGS. 2 and 3. Some of these instructions, such as "resume on restart," may be contingent on whether the exact state of the running program was captured when the system was stopped or reset. This may give rise to an additional "complete image" or state captured object property, as shown in FIG. 3. For instance, the executable information 114 may include the "execution permission", "execute from initial state", "execute from prior state" and "complete image" fields shown in FIG. 3 below.

FIG. 2 is another example block diagram of a device 200 to perform an action on an NVM object after restart. The device 200 may include any type of device to interface with and/or include a NVM, such as a storage device, a controller, a driver, a notebook computer, a desktop computer, an all-in-one system, a server, a network device, a wireless device, a storage device, a mobile device, a thin client, a retail point of sale device, a gaming device, a scientific instrument, and the like.

The device 200 of FIG. 2 may include at least the functionality and/or hardware of the device 100 of FIG. 1. For example, the device 200 includes a property unit 210, an action unit 220 and a NVM 230. The property and action units 210 and 220 of FIG. 2 may include at least at least the respective functionality and/or hardware of the property and action units 110 and 120 of FIG. 1.

The NVM 230 may be any type of memory that retains stored information when power is turned off, such as read-only memory, flash memory, ferroelectric RAM (F-RAM), most types of magnetic computer storage devices (e.g. hard disks, floppy disks, and magnetic tape), optical discs, Memristor-based, Spin-Torque transfer, Phase Change memory, and the like. The term NVM may also refer to storage that can be accessed directly as memory (aka persistent memory).

The NVM 230 is shown to include a plurality of NVM objects 232-1 to 232-n, where n is a natural number. Further, each of the NVM objects 232-1 to 232-n is shown to be associated with one of a plurality of property fields 234-1 to 234-n. The property fields 234-1 to 234-n may each include, for example, a plurality of flags, bits and the like, to represent one or more properties. For instance, each of the property fields 234-1 to 234-n may be a 7 bit register, where each of the bits represent one of the properties shown in the table 300 of FIG. 3 and explained in further detail below and in FIG. 1. A bit or flag of the property field 234 may be marked or set if the corresponding NVM object 232 include the property associated with that bit or flag.

As shown by the property unit 210, the types of properties associated with the NVM objects 232, may further include validity 216 and permission 218 information of the NVM object 232, in addition to the volatility information 112 and executable information 114 of the NVM object 232 explained in FIG. 1. The permission information 218 may further include an encryption key, a password, authentication information and/or authorization information.

The permission information 218 may correlate to at least the "visibility permission" field shown in the table 300 of FIG. 3 and relate to assuring security by limiting the users or tenants who can access an object. This involves the retention of security related information with the NVM object 232 itself. This information may participate in the process of validating the right of a given user or tenant to access the object. Furthermore, access control information indicating, for example, which users can read, write and/or execute the NVM object 232 might be associated with the NVM object 232 through the permission information 218 of the NVM object 232 or using an authorization capability provided by a separate service.

The validity information 216 may include checksum, CRC and/or ECC capability at various granularities that may or may not match that of the entire NVM object 232. NVM objects may also be rendered invalid due to failures that have occurred in the past where recovery is not yet complete. Therefore, the validity information 215 is a property of the NVM object 232 that may be expressed either implicitly or explicitly. The validity information 216 may also be ascertained separately for various parts of NVM object 232, depending on the capability of the hardware where the NVM object 232 resides. While each NVM object 232 is shown to have a separate property field 234, examples may also group a plurality of NVM objects 232 to a single one of the property fields 232 and/or group. For example, volatile NVM objects 232 may be grouped so that object volatility can be determined without examining every object.

The actions of the action unit 220 may be to destroy 222, execute 224, maintain 226 and/or keep 228 the NVM object 232. Destroying 222 the NVM object 232 relates to erasing contents of the NVM object 232. For example, any of the NVM objects 232-1 to 232-n may be destroyed by writing a pattern over the NVM objects 232-1 to 232-n and/or denying access to the NVM objects 232-1 to 232-n.

Maintaining 226 the NVM object 232 relates to designating the NVM object 232 as unusable. Executing 224 the NVM object 232 relates to at least one of restarting a process image contained in the NVM object 232 from an initial state and resuming execution of the process image from a prior state. Keeping 228 the NVM object 232 relates to retaining the NVM object 232 without performing any action on the NVM object 232 while the device 200 is restarted.

The action unit 220 may destroy 222 the NVM object 232, if the property unit 210 determines that the NVM object 232 is marked as volatile 112. The action unit 220 may maintain 226 the NVM object 232, if the property unit 210 determines that the NVM object 232 is marked as invalid 216. Validity 216 may be determined by computing at least one of a checksum, CRC and ECC on the NVM object 232. The volatility information 112 may be set when the NVM object 232 is at least one of created and allocated for a specific purpose and the volatility information 112 may not be reset by the restart.

The action unit 220 may execute 224 the NVM object 232, if the property unit 210 determines the NVM object 232 to be executable 114. The action unit 220 may execute 224 the NVM object 232 from one of the initial and prior state based on a field of the executable information 114. The NVM object 232 may be determined to be executable if the device 200 completes capturing a complete image of the NVM object 232 before the restart. The NVM object 232 may be determined to be not executable if the device 200 does not complete capturing the complete image of the NVM object 232 before the restart.

The action unit 220 may keep 228 any NVM object 232 that is not at least one of destroyed, maintained and executed. For example, the NVM object 232 may be kept if it is not volatile and valid but lacks visibility permission, lacks execution permission, lacks the ability to execute from the initial state or has an ability to execute from the prior state yet lacks the complete image. The visibility permission 218 may relate to a right of a user to at least one of view and read the NVM object 232. The execution permission 114 may relate to the right of the user to execute the NVM object 232 from at least one of the initial and prior states.

The action unit 220 may execute the plurality of the NVM objects 232-1 to 232-n that are marked to have the execution permission 114. An order the plurality of NVM objects 232-1 to 232-n are executed 224 by the action unit 210 may be based on dependencies between the NVM objects 232-1 to 232-n. For example, the NVM objects 232-1 to 232-n having no dependencies may be executed 224 before the NVM objects 232-1 to 232-n having dependencies. Also, the NVM objects 232-1 to 232-n having dependencies that are resolved may be executed 224 before the NVM objects 232-1 to 232-n having dependencies that are not resolved. Further, the execution 224 of the plurality of NVM objects 232-1 to 232-n may be pipelined. The NVM objects 232-1 to 232-n marked as volatile may be destroyed 222 before the NVM objects 232-1 to 232-n marked as having the execution permission 114 are executed 224.

FIG. 3 is an example table 300 of actions by the device of FIG. 2 based on a property of the NVM object 232. When a system or device restarts, the state of its NVM may be checked to see what action may need to be taken on the NVM objects. The actions that may be taken by the action unit 220 of the device 200 are shown by the "Action" column of the table 300. These actions include destroy, execute, maintain and keep. The remaining columns of the table 300 indicate possible properties of the NVM object 232. These properties include volatile, valid, visibility permission, execute from initial state, execute from prior state and complete image.

A true (T) value may indicate that the NVM object 232 is marked to have the corresponding property while a false (F) value may indicate that the NVM object 232 does not have the corresponding property. A don't care (*) value may indicate that the value of the corresponding property is not important to determining the action to be carried out on the NVM object 232.

The destroy action 222 may relate to erasing the content of the NVM object 232. This action may only apply to NVM objects 232 that have the volatile property 112. The execute action 224 may restore the process image contained in the NVM object 232 and resume its execution. A variation on the execute action may involve restarting the process from an initial state rather than its prior state. This action may apply to NVM objects 232 that contain executable images 114.

The maintain action 226 may designate the NVM object as unusable until some maintenance can be performed. This action may apply to NVM objects 232 that are determined to be invalid 216. The keep action 228 may retain the NVM object 232 without performing any special action on it during the restart. This may be the default action for NVM objects 232.

The action taken on each NVM object 232 may be determined by properties 234 of the NVM object 232. The volatility property 112 may originate with the prior configuration of the system or device 200. When a NVM object 232 is created or allocated for a specific purpose the volatile property 234 may be set and retained until that NVM object 234 is destroyed and the underlying NVM 230 cleared and deallocated. A system or device 200 restart may or may not cause the volatile property 234 to be reset, depending on whether or not the volatile NVM object 234 is also deallocated during the restart.

The validity property 234 may be determined by computing a validity check such as a checksum. CRC or ECC on the object. Some systems or devices 200 may retain information that enables immediate validity checking to be limited to active or suspect objects. Others may require that object validity be checked on all NVM objects 232. In some cases, this may be contingent on the type of restart being executed. Once the validity check has been performed the validity property 234 of each NVM object 232 may be set correctly.

The visibility permission 234 information, such as encryption keys, passwords and other use authentication and authorization information, may be acquired through processes. As with several other properties, this property may be established when NVM objects 232 are created. The system or device 200 may assure availability of a sufficient subset of those permissions necessary to validate a user's right to execute a process image as of the point when the restart decisions described here are made.

Similar to the volatile property 234, the execute permission, execute from initial state and execute from prior state properties 234 may originate with prior configuration based on the purpose of the NVM object 234. A "complete image" may be set when the system or device 200 completes the capturing of the complete image as it is stopped. The "complete image" property may be reset as execution of the process image retained in an object begins or resumes. It is set when the system or device 200 completes the capturing of the complete image as it is stopped. Certain non-graceful restarts may inhibit the system or device's 200 ability to capture complete images.

The table 300 may define the following series of decisions during restart of the device 200. For each NVM object 232 marked as volatile, the device 200 may destroy the contents of the NVM object 232. This may be accomplished by writing a pattern over the NVM object 232 or by making it inaccessible. For example, the NVM object 232 may be rendered inaccessible by invalidating its key or pass-code.

For each remaining NVM object 232, if the NVM object 232 is invalid, the device 200 may record a need for maintenance of the NVM object 232 in a log and retain the NVM object 232 until such time as further recovery decisions can be made. For each remaining NVM object 232, if visibility is permitted to a principal controlling the restart, the device 200 may check for execution permission 114. The principal may be a user, group or other authority such as a hypervisor or guest root. Restarts may occur in several scopes such as individual processes (as part of process migration), virtual machines, nodes or clusters. If the principal controlling the restart has visibility and execute permission and the NVM object 232 has the execute from the initial state property, then the device 200 may place the NVM object 232 in a list of objects to execute.

Any remainder of the plurality of NVM objects 232 that are not at least one of destroyed, maintained and executed, may be kept by the device 200. For example, NVM objects 232 may be kept that are not volatile and valid but lack visibility permission, lack execution permission, lack the ability to execute from the initial state or have an ability to execute from the prior state yet lack the complete image.

If the principal controlling the restart has visibility and execution permission 114 and 218, the NVM object 232 has the execute from prior state property and the NVM object 232 has the complete image captured property, then the device 200 may place the NVM object 232 in the list of objects to execute. If the NVM object 232 is not volatile, the device 200 retains the NVM object 232 for future reference. At this point, order of execution of the executable NVM objects 232 may be determined by the device 200, as explained above.

For instance, a statement of the dependencies between the NVM executable objects 232 may be provided as part of the configuration of the system or device 200. Such a statement of dependencies may be captured, for example, in the form of a makefile. However, in this case the executable statements in the makefile may be correlated with the NVM objects 232 in the execution list. Those NVM objects 232 with no dependencies may execute first, after which those NVM objects 223 that have resolved dependencies may then execute. Alternatively, execution dependencies may be expressed as additional NVM object properties. These properties may also be configured directly or derived from the makefile format.

Although the above process including selective execution of NVM objects 232 is described linearly, examples may also execute the NVM objects 232 as a pipeline. For example, as the NVM object 232 passes from a first step in a process to a second step, another NVM object 232 may proceed to the first step. However, no image may execute before all volatile NVM objects 232 are destroyed. In the pipeline execution model, any NVM object 232 that reaches the execution list and has no unmet dependencies may execute immediately.

Figure 4:
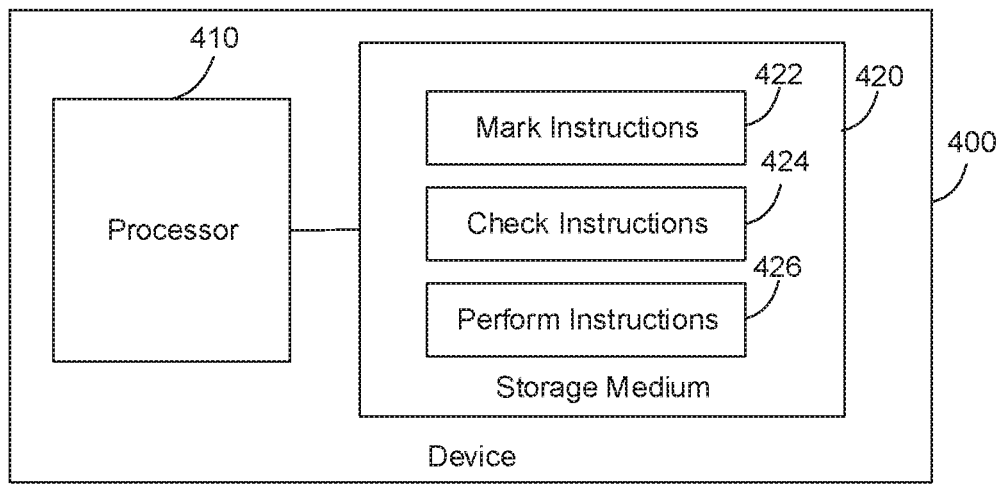
FIG. 4 is an example block diagram of a computing device including instructions for performing an action on an NVM object based on the property of the NVM object.

FIG. 4 is an example block diagram of a computing device 400 including instructions for performing an action on the NVM object based on the property of the NVM object. In the embodiment of FIG. 4, the computing device 400 includes a processor 410 and a machine-readable storage medium 420. The machine-readable storage medium 420 further includes instructions 422, 424 and 426 for performing an action on the NVM object based on the property of the NVM object.

The computing device 400 may be, for example, a secure microprocessor, a notebook computer, a desktop computer, an all-in-one system, a server, a network device, a controller, a wireless device, or any other type of device capable of executing the instructions 422, 424 and 426. In certain examples, the computing device 400 may include or be connected to additional components such as memories, controllers, etc.

The processor 410 may be, at least one central processing unit (CPU), at least one semiconductor-based microprocessor, at least one graphics processing unit (GPU), other hardware devices suitable for retrieval and execution of instructions stored in the machine-readable storage medium 420, or combinations thereof. The processor 410 may fetch, decode, and execute instructions 422, 424 and 426 to implement performing an action on the NVM object based on the property of the NVM object. As an alternative or in addition to retrieving and executing instructions, the processor 410 may include at least one integrated circuit (IC), other control logic, other electronic circuits, or combinations thereof that include a number of electronic components for performing the functionality of instructions 422, 424 and 426.

The machine-readable storage medium 420 may be any electronic, magnetic, optical, or other physical storage device that contains or stores executable instructions. Thus, the machine-readable storage medium 420 may be, for example, Random Access Memory (RAM), an Electrically Erasable Programmable Read-Only Memory (EEPROM), a storage drive, a Compact Disc Read Only Memory (CD-ROM), and the like. As such, the machine-readable storage medium 420 can be non-transitory. As described in detail below, machine-readable storage medium 420 may be encoded with a series of executable instructions for performing an action on the NVM object based on the property of the NVM object.

Figure 5:
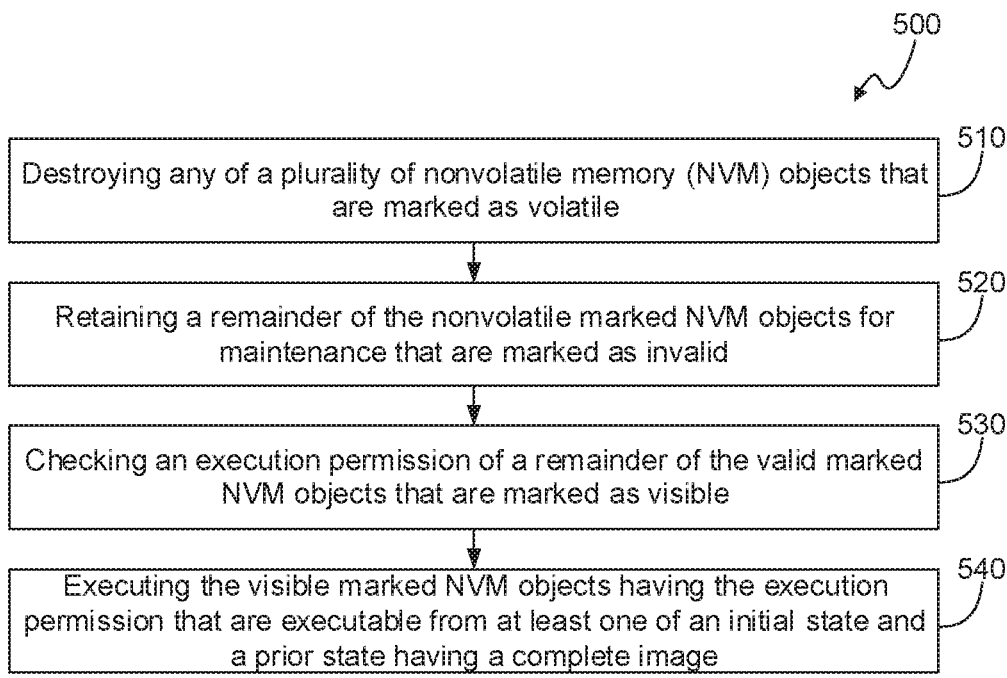
FIG. 5 is an example flowchart of a method for acting on an NVM object based on a marking of the NVM object.

Moreover, the instructions 422, 424 and 426 when executed by a processor (e.g., via one processing element or multiple processing elements of the processor) can cause the processor to perform processes, such as, the process of FIG. 5. For example, the mark instructions 422 may be executed by the processor 410 to mark a property of an object in nonvolatile memory (NVM) of the device 400 before the device 400 is restarted. The check instructions 424 may be executed by the processor 410 to check the property of the NVM object after the device is restarted. The perform instructions 426 may be executed by the processor 410 to perform an action on the NVM object based on the property of the NVM object. The property may include volatility and/or executable information of the NVM object.

FIG. 5 is an example flowchart of a method 500 for acting on an NVM object based on a marking of the NVM object. Although execution of the method 500 is described below with reference to the driver device 200, other suitable components for execution of the method 500 may be utilized, such as the driver device 100. Additionally, the components for executing the method 500 may be spread among multiple devices (e.g., a processing device in communication with input and output devices). In certain scenarios, multiple devices acting in coordination can be considered a single device to perform the method 500. The method 500 may be implemented in the form of executable instructions stored on a machine-readable storage medium, such as storage medium 420, and/or in the form of electronic circuitry.

At block 510, the device 200 destroys 222 any of a plurality of nonvolatile memory (NVM) objects 232-1 to 232-n that are marked as volatile 112. For example, any of the NVM objects 232-1 to 232-n may be destroyed by writing a pattern over the NVM objects 232 and/or denying access to the NVM objects 232. Then, at block 520, the device 200 retains 226 a remainder of the nonvolatile marked NVM objects 232-1 to 232-n for maintenance that are marked as invalid 112. At block 530, the device 200 checks an execution permission 114 of a remainder of the valid marked NVM objects 232-1 to 232-n that are marked as visible. The execution permission 114 may be based on a type of user logged onto the device 200. At block 540, the device 200 executes 224 the visible marked NVM objects 232-1 to 232-n having the execution permission 114 that are executable from an initial state and/or a prior state having a complete image.

FIG. 6 is another example flowchart of a method 600 for acting on an NVM object based on a marking of the NVM object. Although execution of the method 600 is described below with reference to the driver device 200, other suitable components for execution of the method 600 may be utilized, such as the driver device 100. Additionally, the components for executing the method 600 may be spread among multiple devices (e.g., a processing device in communication with input and output devices). In certain scenarios, multiple devices acting in coordination can be considered a single device to perform the method 600. The method 600 may be implemented in the form of executable instructions stored on a machine-readable storage medium, such as storage medium 420, and/or in the form of electronic circuitry.

At block 610, the device 200 including the NVM objects 232-1 to 232-n restarts. After restarting, at block 620, the device 200 destroys 222 any of a plurality of nonvolatile memory (NVM) objects 232-1 to 232-n that are marked as volatile 112. Then, at block 630, the device 200 retains 226 a remainder of the nonvolatile marked NVM objects 232-1 to 232-n for maintenance that are marked as invalid 112. At block 640, the device 200 checks an execution permission 114 of a remainder of the valid marked NVM objects 232-1 to 232-n that are marked as visible.

At block 650, the device 200 executes 224 the visible marked NVM objects 232-1 to 232-n having the execution permission 114 that are executable from at least one of an initial state and a prior state having a complete image, At block 660, the device 200 keeps 228 the remainder of the NVM objects 232-1 to 232-n that are not at least one of destroyed, retained for maintenance and executed at blocks 620, 630 and 650.

I claim:

1. A device, comprising:
   a nonvolatile memory (NVM) including an object, wherein the nonvolatile memory is directly addressable by a processor of a computing system;
   a property unit to determine a property of the NVM object in response to a restart of the computing system; and
   an action unit to perform an action on the NVM object based on the determined property of the NVM object and in response to the restart of the computing system, wherein
   the property includes at least one of a volatility and executable information of the NVM object;
   wherein the action unit selectively performs the action to destroy, execute, maintain, or keep the NVM object, maintaining the NVM object relates to designating the NVM object as unusable, and executing the NVM object relates to at least one of restarting a process image contained in the NVM object from an initial state and resuming execution of the process image from a prior state,
   wherein the action unit is to execute the NVM object, if the property unit determines the NVM object to be executable because the NVM object the device completes capturing a complete image of the NVM object before the restart.

2. The device of claim 1, wherein,
   the property further includes at least one of validity and permission information of the NVM object, and
   the permission information further includes at least one of an encryption key, a password, authentication information and authorization information.

3. The device of claim 1, wherein,
   destroying the NVM object relates to erasing contents of the NVM object, and
   keeping the NVM object relates to retaining the NVM object without performing any action on the NVM object while the device is restarted.

4. The device of claim 1, wherein,
   the action unit is to destroy a second NVM object, if the property unit determines that the second NVM object is marked as volatile, and
   the action unit is to maintain the second NVM object, if the property unit determines that the NVM object is marked as invalid.

5. The device of claim 4, wherein,
   validity is determined by computing at least one of a checksum, CRC and ECC on the second NVM object, and
   the volatility information is set when the second NVM object is at least one of created and allocated for a specific purpose and the volatility information is not reset by the restart.

6. The device of claim 1, wherein,
   the action unit is to execute the NVM object, if the property unit determines the NVM object to be executable, and
   the action unit is to execute the NVM object from one of the initial and prior state based on a field of the executable information.

7. The device of claim 6, wherein,
   a second NVM object is determined to be not executable if the device does not complete capturing a complete image of the second NVM object before the restart.

8. The device of claim 1, wherein,
   the action unit is to execute a plurality of the NVM objects that are marked to have an execution permission and a visibility permission,
   the NVM objects marked as volatile are destroyed before the NVM objects marked as having the execution and visibility permissions are executed, and
   the action unit is to keep any of the plurality of NVM objects not at least one of destroyed, maintained and executed.

9. The device of claim 8, wherein,
   the visibility permission relates to a right of a user to at least one of view and read the NVM object,
   the execution permission relates to the right of the user to execute the NVM object from at least one of the initial and prior states, and
   an order the plurality of NVM objects are executed by the action unit is based on dependencies between the NVM objects.

10. The device of claim 9, wherein,
the NVM objects having no dependencies are executed before the NVM objects having dependencies, and
the NVM objects having dependencies that are resolved are executed before the NVM objects having dependencies that are not resolved.

11. A method, comprising:
during a restart of a computing system that includes a persistent memory directly accessible by a processor, by a driver device of the computing system, performing:
destroying any of a plurality of nonvolatile memory (NVM) objects included in the persistent memory that are marked as volatile;
retaining a remainder of the nonvolatile marked NVM objects for maintenance that are marked as invalid; and
checking an execution permission of a remainder of the valid marked NVM objects that are marked as visible; and
executing a first of the visible marked NVM objects having the execution permission that are executable based on a determination that a complete image of the first NVM object was captured before the restart of the computing system.

12. The method of claim 11, further comprising:
restarting the computing system including the NVM objects, before the destroying; and
keeping the remainder of the NVM objects that are not at least one of destroyed, retained for maintenance and executed.

13. The method of claim 11, wherein,
any of the NVM objects are destroyed by at least one writing a pattern over the NVM objects and denying access to the NVM objects, and
the execution permission is based on a type of user logged onto the device.

14. A non-transitory computer-readable storage medium storing instructions that, if executed by a processor of a device, cause the processor to:
mark a property of an object in nonvolatile memory (NVM) of the device before the device is restarted, wherein the NVM is directly addressable by a processor of a computing system;
check the property of the NVM object after the device is restarted;
determine whether the device completes capture of a complete image of the NVM object before the restart; and
perform an action on the NVM object based on the property of the NVM object, wherein
the property includes executable information of the NVM object,
wherein the NVM object is determined to be executable in response to the device completes capture of the complete image of the NVM object before the restart,
wherein the NVM object is determined to be not executable if the device does not complete capture of the complete image of the NVM object before the restart, and
wherein the action corresponds to execution of the NVM object corresponding to whether the NVM object is determined to be executable.

15. The non-transitory computer-readable storage medium of claim 14 further storing instructions that, if executed by the processor of the device, cause the processor to:
mark another property of another object in the NVM before the device is restarted,
wherein the other property includes volatility information associated with the other object; and
after the device is restarted, destroy the other object if the volatility information indicates that the other object is volatile.

* * * * *